United States Patent
Toth et al.

(10) Patent No.: US 8,299,432 B2
(45) Date of Patent: Oct. 30, 2012

(54) SCANNING TRANSMISSION ELECTRON MICROSCOPE USING GAS AMPLIFICATION

(75) Inventors: Milos Toth, Portland, OR (US); William Ralph Knowles, Hillsboro, OR (US); Rae Knowles, legal representative, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 576 days.

(21) Appl. No.: 12/264,805

(22) Filed: Nov. 4, 2008

(65) Prior Publication Data

US 2010/0108881 A1 May 6, 2010

(51) Int. Cl.
*G01N 23/00* (2006.01)

(52) U.S. Cl. ........ 250/311; 250/306; 250/307; 250/309; 250/492.1; 250/492.3

(58) Field of Classification Search ........................ None
See application file for complete search history.

(56) References Cited

U.S. PATENT DOCUMENTS

| | | | |
|---|---|---|---|
| 2,929,949 A | 3/1960 | Vincent | |
| 4,382,182 A * | 5/1983 | Matsuzaka et al. | 250/307 |
| 4,596,928 A | 6/1986 | Dantilatos | |
| 4,601,211 A | 7/1986 | Whistler et al. | |
| 4,785,182 A | 11/1988 | Mancuso et al. | |
| 4,823,006 A | 4/1989 | Danilatos et al. | |
| 4,880,976 A | 11/1989 | Mancuso et al. | |
| 4,897,545 A | 1/1990 | Danilatos | |
| 4,992,662 A | 2/1991 | Danilatos | |
| 5,250,808 A | 10/1993 | Danilatos et al. | |
| 5,362,964 A | 11/1994 | Knowles et al. | |
| 5,396,067 A | 3/1995 | Suzuki et al. | |
| 5,412,211 A | 5/1995 | Knowles | |
| 5,578,821 A | 11/1996 | Meisberger et al. | |
| 5,828,064 A | 10/1998 | Knowles | |
| 5,945,672 A | 8/1999 | Knowles et al. | |
| 5,986,264 A | 11/1999 | Grunewald | |
| 6,011,265 A * | 1/2000 | Sauli | 250/374 |
| 6,025,592 A | 2/2000 | Knowles et al. | |
| 6,172,363 B1 | 1/2001 | Shinada et al. | |
| 6,184,525 B1 * | 2/2001 | Van Der Mast | 250/310 |
| 6,365,896 B1 | 4/2002 | Van Der Mast | |
| 6,396,063 B1 * | 5/2002 | Danilatos | 250/386 |
| 6,525,317 B1 * | 2/2003 | Yang | 250/310 |
| 6,538,254 B1 | 3/2003 | Tomimatsu et al. | |
| 6,583,413 B1 * | 6/2003 | Shinada et al. | 850/9 |
| 6,590,210 B1 | 7/2003 | Essers | |

(Continued)

FOREIGN PATENT DOCUMENTS

EP 1724809 11/2006

(Continued)

OTHER PUBLICATIONS

Folch, Albert, et al. 'High-Vacuum Versus "environmental" electron beam deposition,' J. Vac. Sci. Technol. B, Jul./Aug. 1996, pp. 2609-2614, vol. 14, Issue 4.

(Continued)

*Primary Examiner* — Michael Logie
(74) *Attorney, Agent, or Firm* — Scheinberg & Associates, PC; Michael O. Scheinberg

(57) ABSTRACT

A scanning transmission electron microscope operated with the sample in a high pressure environment. A preferred detector uses gas amplification by converting either scattered or unscattered transmitted electrons to secondary electrons for efficient gas amplification.

22 Claims, 6 Drawing Sheets

U.S. PATENT DOCUMENTS

| | | | |
|---|---|---|---|
| 6,707,041 B2 | 3/2004 | Essers | |
| 6,914,243 B2 | 7/2005 | Sheehan et al. | |
| 6,943,352 B2 * | 9/2005 | Hayn | 850/14 |
| 6,979,822 B1 | 12/2005 | Stewart et al. | |
| 7,060,976 B2 | 6/2006 | Sheehan et al. | |
| 7,193,222 B2 * | 3/2007 | Jacka et al. | 250/397 |
| 7,462,839 B2 * | 12/2008 | Gnauck et al. | 250/397 |
| 7,541,580 B2 | 6/2009 | Knowles et al. | |
| 7,718,979 B2 | 5/2010 | Knowles | |
| 2003/0168595 A1 * | 9/2003 | Danilatos | 250/310 |
| 2003/0201393 A1 * | 10/2003 | Tsuneta et al. | 250/311 |
| 2004/0124356 A1 * | 7/2004 | Scholtz et al. | 250/310 |
| 2005/0103272 A1 | 5/2005 | Koops et al. | |
| 2007/0152151 A1 * | 7/2007 | Schmidt et al. | 250/311 |
| 2007/0187597 A1 * | 8/2007 | Suzuki et al. | 250/310 |
| 2009/0050803 A1 * | 2/2009 | Tanba et al. | 250/310 |
| 2009/0242758 A1 | 10/2009 | Uncovsky et al. | |
| 2010/0056549 A1 | 3/2010 | Weissman et al. | |

FOREIGN PATENT DOCUMENTS

| | | |
|---|---|---|
| JP | 05174768 | 7/1993 |
| JP | 5258701 | 10/1993 |
| WO | WO 9822971 A2 * | 5/1998 |
| WO | WO9930344 | 6/1999 |
| WO | 2008098084 | 8/2008 |

OTHER PUBLICATIONS

Jacka, Marcus, et al., 'A Differentially Pumped Secondary Electron Detector for Low-Vacuum Scanning Electron Microscopy,' Scanning, 2003, pp. 243-246, vol. 25.

Slowko, Witold, 'Secondary electron detector with a micro-porous plate for environmental SEM,' Vacuum, 2001, pp. 457-451, vol. 63.

Crawford, C.K., 'Charge Neutralization Using Very Low Energy Ions,' Scanning Electron Microscopy, 1979, pp. 31-47, II.

Slowko, Witold and Herbert Prasol, Micro-sphere plate as an electron detector at low vacuum, 2002, pp. 191-198, vol. 67.

Mathieu,C., 'The Beam-Gas and Signal-Gas Interactions in the Variable Pressure Scanning Electron Microscope', Scanning Microscope,1999, pp. 23-41, vol. 13, No. 1.

Phillips, M.R., et al. "Enhanced High Speed SE Imaging in a VPSEM Using a Frisch Grid," Microsc Microanal 12 (Supp. 2), 2006 pp. 1480-1481.

Toth, M., et al., "On the role of electron-ion recombination in low vacuum scanning electron microscopy," Journal of Microscopy, Jan. 2002, pp. 86-95, vol. 205, Pt. 1.

Danilatos, G.D., "Introduction to the ESEM Instrument," Microscopy Research and Technique, Jan. 1, 1993, pp. 354-361, vol. 25.

* cited by examiner

SCANNING TRANSMISSION ELECTRON MICROSCOPE USING GAS AMPLIFICATION

TECHNICAL FIELD OF THE INVENTION

The present invention relates generally to electron microscopy, and more particularly to detectors for a high pressure scanning transmission electron microscope.

BACKGROUND OF THE INVENTION

Three primary types of electron microscopes are the scanning electron microscope (SEM), the transmission electron microscope (TEM) and the scanning transmission electron microscope (STEM). In an SEM, a primary electron beam is focused to a fine spot that scans the surface to be observed. Some of the electrons in the primary beam are backscattered when they hit the sample. Also, secondary electrons are emitted from the surface as it is impacted by the primary beam. The secondary electrons or backscattered electrons are detected, and an image is formed, with the brightness at each point of the image being determined by the number of secondary or backscattered electrons detected when the beam impacts a corresponding point on the surface.

Backscattered electrons are typically detected using a solid state detector comprising a p-n junction that conducts electricity when the backscattered electrons create charge carriers within the detector depletion region. The term "solid state detector" as used herein refers to a detector that includes a depletion region to detect incident electrons. Backscattered electrons are sometimes detected using a combination of a scintillator and a photomultiplier tube, the backscattered electrons causing a flash of the scintillator and the signal from the scintillator being amplified by the photomultiplier tube. Solid state detectors are typically preferred over "scintillator-photomultiplier" detectors for backscattered electron imaging because they are more compact, and easier to incorporate inside an SEM specimen chamber. Secondary electrons have much lower energies than backscattered electrons and can therefore be steered by modest electric fields inside the SEM specimen chamber. As such, placement of secondary electron detectors is more flexible than that of backscattered electron detectors, and secondary electrons are typically detected using a scintillator-photomultiplier detector. In some circumstance, solid state detectors are also used for secondary electron imaging. Scintillator-photomultiplier detectors have some advantages over solid state detectors, such as favorable bandwidth and signal-to-noise ratio characteristics. Secondary electrons possess low energies (0 to approximately 50 eV) and must therefore be accelerated to an energy typically in the range of 2 to 20 keV and more typically 5 to 10 keV prior to collection by a solid state detector or a scintillator-photomultiplier detector.

In a TEM, a broad beam of high energy electrons is directed to the sample and the electrons that are transmitted through the sample form an image on a fluorescent screen or a photographic plate. The sample must be sufficiently thin to allow many of the electrons in the primary beam to travel though the sample. Samples are typically thinned to a thickness of less than 100 nm.

In an STEM, a primary electron beam is focused to a fine spot, and the spot is scanned across the sample surface. Electrons that are transmitted through the work piece are collected by an electron detector on the far side of the sample. The scattering of the electron beam at different points on the sample depends on the sample properties, such as the atomic number and thickness. An image is formed with the intensity of each point on the image corresponding to the number of electrons collected as the primary beam impacts a corresponding point on the surface. The image contrast in a STEM depends on detecting only electrons that are transmitted with minimum deflections (referred to as "bright field" detection) or detecting only electrons that are scattered at an angle greater than a specified minimum angle (referred to as "dark field" detection.) The term "unscattered" electrons as used herein means electrons that are scattered at less than a pre-specified angle. If a detector were to detect all transmitted electrons, regardless of their exit angle from the sample with respect to the electron beam axis, each pixel would have similar brightness, and the image contrast would correspond to differences between the energy of electrons transmitted through different regions of the sample. Such "electron energy attenuation" contrast arises from the fact that the efficiency of STEM detectors such as solid state detectors and scintillator-photomultiplier detectors is a function of the transmitted electron energy. However, the energy spectrum of transmitted electrons is typically relatively narrow and the corresponding electron energy attenuation contrast is weak and vastly inferior to bright and dark field image contrast.

Because the transmitted electrons have a high energy, both scintillator-photomultiplier and solid state detectors can be used in a STEM. Solid state electron detectors for use in a STEM can have a center region, which detects unscattered electrons, surrounded by one or more annular regions, which detect scattered electrons. A "dead space" is required between the detector regions, to prevent charges generated in one region from leaking into an adjacent region. Multi-region detectors can be replaced using a single region solid state detector or a single region scintillator-photomultiplier detector by placing an aperture or an electron absorbing material (referred to as a "beam stop") below the sample to enable bright or dark field electron imaging, respectively. Because the primary beam of a STEM is scanned in the same manner as the beam in an SEM, an SEM can be provided with a detector positioned under the sample to operate as a STEM. Solid state detectors are typically preferred over scintillator-photomultiplier detectors because they are more compact and easier to incorporate inside an SEM specimen chamber.

Most electron microscopes operate in a high vacuum to avoid scattering of the primary electron beam. SEMs that operate with the sample under a relatively high pressure are described for example in U.S. Pat. No. 4,785,182 for "Secondary Electron Detector for Use in a Gaseous Atmosphere." Such devices are known as environmental scanning electron microscopes or as high pressure scanning electron microscopes (HPSEMs). In the context of this application, "high pressure" means a pressure of greater than about 0.01 Torr. Commercially available systems include the ESEM® high pressure scanning electron microscope from FEI Company, the assignee of the present invention. Because electrons in the primary beam are scattered by gas molecules, an HPSEM uses a pressure limiting aperture (PLA) between the relatively high pressure sample chamber and the electron focusing column to maintain a high vacuum in the electron optical column. The diameter of the PLA is sufficiently small to prevent rapid flow of the gas molecules from the higher pressure sample chamber into the lower pressure focusing column. The majority of the electron beam path is therefore in the low pressure column, and the beam travels only a short distance in the gaseous environment below the PLA.

In an HPSEM, the sample that is to be investigated is placed in an atmosphere of a gas having a pressure typically between 0.01 Torr (1.3 Pa) and 50 Torr (7000 Pa), and more typically between 1 Torr (130 Pa) and 10 Torr (1,300 Pa) whereas in a conventional SEM the sample is located typically in a vacuum of about $10^{-6}$ Torr ($1.3\times10^{-6}$ mbar). Unlike a conventional SEM, an HPSEM can readily form electron-optical images of moist or non-conducting samples, such as biological samples, plastics, ceramic materials and glass fibers, which would be difficult to image under the typical vacuum conditions of a conventional SEM. The HPSEM allows samples to be maintained in their natural state, without being subjected to the disadvantageous effects of drying, freezing or vacuum coating, which are normally necessary in studies of such samples using conventional SEMs. The gaseous atmosphere of an HPSEM sample chamber provides inherent charge neutralization, that is, the dissipation of surface charge that accumulates on a non-conductive sample as a result of irradiation. Dissipating surface charge increases resolving power of the microscope.

The gas type used in an HPSEM can be selected so as to enable electron-beam induced chemical processing of the sample. In such processes, electrons dissociate gas molecules adsorbed to the sample surface to produce reactive fragments that give rise to material deposition or volatilization in the vicinity of the electron beam. For example, Adachi et al. [*Applied Surface Science* 76, 11 (1994)] used $CH_4$ to deposit carbon, Folch et al. [*Applied Physics Letters* 66, 2080 (1995)] used $Au(CH_3)_2$(hexafluoroacetylacetonate) to deposit Au-containing nanocomposites, Ochiai et al., [*Journal of Vacuum Science and Technology B* 14, 3887 (1996)] used (HFA•Cu•VTMS) to deposit Cu-containing nanocomposites, Li et al. [*Applied Physics Letters* 93, 023130 (2008)] used $WF_6$ to deposit $WO_3$-containing Nanocomposites, and Toth et al. [*Journal of Applied Physics* 101, 054309 (2007)] used $XeF_2$ to etch Cr.

Conventional scintillator-photomultipliers and solid state detectors can not be used for secondary electron imaging in a gaseous atmosphere, because the detector bias needed to accelerate the low energy secondary electrons to the energy needed for efficient detector operation will cause dielectric breakdown of the gas. An HPSEM, therefore, uses a different mode of detection, referred to as gas cascade amplification. In gas cascade amplification, a voltage is applied between the sample surface and a metal electrode ("anode"). The liberated secondary electrons are accelerated toward the anode and collide en route with gas molecules in their path. These collisions will result in the liberation of new electrons, referred to as "daughter electrons," and gaseous ions from the gas molecules. The daughter electrons and the ions will move towards and away from the anode, respectively. In their turn, these newly liberated daughter electrons will again collide with other gas molecules, and so forth, so that a cascade amplification of the secondary electron signal occurs. The gas-cascade-amplified secondary electron imaging signal is detected by measuring a current flow induced in electrodes such as the anode or the specimen holder, or by detecting photons generated by the gas cascade.

Combining a high pressure sample environment with an STEM presents difficulties. Conventional gas cascade amplification as used in a HPSEM will not produce adequate contrast in a STEM. The image contrast of a STEM is derived from separately detecting either transmitted electrons that are scattered by the sample or transmitted electrons that are not scattered by the sample. The gas in a high pressure sample environment process, however, scatters the transmitted electrons, and thereby mixes the scattered and unscattered transmitted electron signals, impeding the formation of a useable image. In addition, gas cascade detectors measure the signal induced in an electrode by the motion of charge in the gas, or luminescence generated by the gas cascade. Both of these signals are omnidirectional and serve to further mix the scattered and unscattered transmitted electron imaging signals, thereby impeding further the formation of a useful image.

Conventional scintillator-photomultiplier detectors are impractical for high pressure STEM because they are bulky and difficult to incorporate below a sample in a HPSEM chamber. Hence, solid state detectors are typically used for transmitted electron imaging in HPSEM systems. However, solid state detectors suffer from a number of problems. When imaging a wet sample, water droplets may fall on the detector below. Common samples include cross-sectioned biological tissue and liquids suspended on perforated membranes, and often contain loose materials such as organic residue and nanoparticles. Such loose materials may be transported by the falling water droplets and may deposit on the detector surface. Because a solid state detector requires electrons to strike the depletion region with sufficient energy to excite the electron-hole pairs, any material on top of the detector reduces the number and energy of electrons reaching the depletion region, causing a loss of efficiency of the detector. For example, with just a micron of residue on the surface of the detector, a 30 kV electron might lose half its energy but still deposit 15 kV into the detector, but a 10 kV electron might lose all of its energy in the residue and not deposit any energy into the detector. Alternatively, a transmitted electron may be backscattered by the residue, and hence not deposit any energy into the depletion region. If a scintillator-photomultiplier detector is used in place of the solid state detector, it will suffer from an analogous problem. A scintillator-photomultiplier detector requires electrons to strike the scintillator with sufficient energy to excite photons, and any material on top of the detector reduces the energy of electrons reaching the scintillator and the number of electrons reaching the scintillator, thereby lowering the number of photons generated per transmitted electron, causing a loss of detector efficiency. Solid state detectors and scintillators are also fragile and difficult to clean.

Moreover, solid state detectors and scintillator-photomultiplier detectors are not compatible with some of the precursors used for electron-beam induced chemical processing. Some such precursors are highly reactive, and some, like $XeF_2$, may spontaneously etch detector components. Even if the detector were not spontaneously etched, the detector surface would be subjected to charged-particle-induced reactions as the sample, because the charged particles that are transmitted tough the sample impact on the detector in the presence of the precursors. This problem is particularly severe in HPSEM systems where the precursor pressure at the detector surface is typically similar or equal to the precursor pressure at the sample surface.

Although solid state detectors are commercially available for converting a SEM to a STEM, such detectors are not practical for use in a high pressure environment.

SUMMARY OF THE INVENTION

An object of the invention therefore is to provide a scanning transmission electron microscope in which the sample is maintained at a relatively high pressure.

An electrode is placed beneath the sample to detect electrons transmitted through a sample maintained in a high pressure environment. The signal from electrons that are transmitted through the sample with little or no scattering is separated from the signal from electrons that are scattered as they are transmitted through the sample. Preferred embodiments use gas amplification in a region below the sample to amplify the electron signal. In some preferred embodiments, either the transmitted scattered electrons or the transmitted unscattered electrons are converted to secondary electrons which are amplified using gas cascade amplification. The transmitted electrons that are not converted do not contribute appreciably to the imaging signal.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
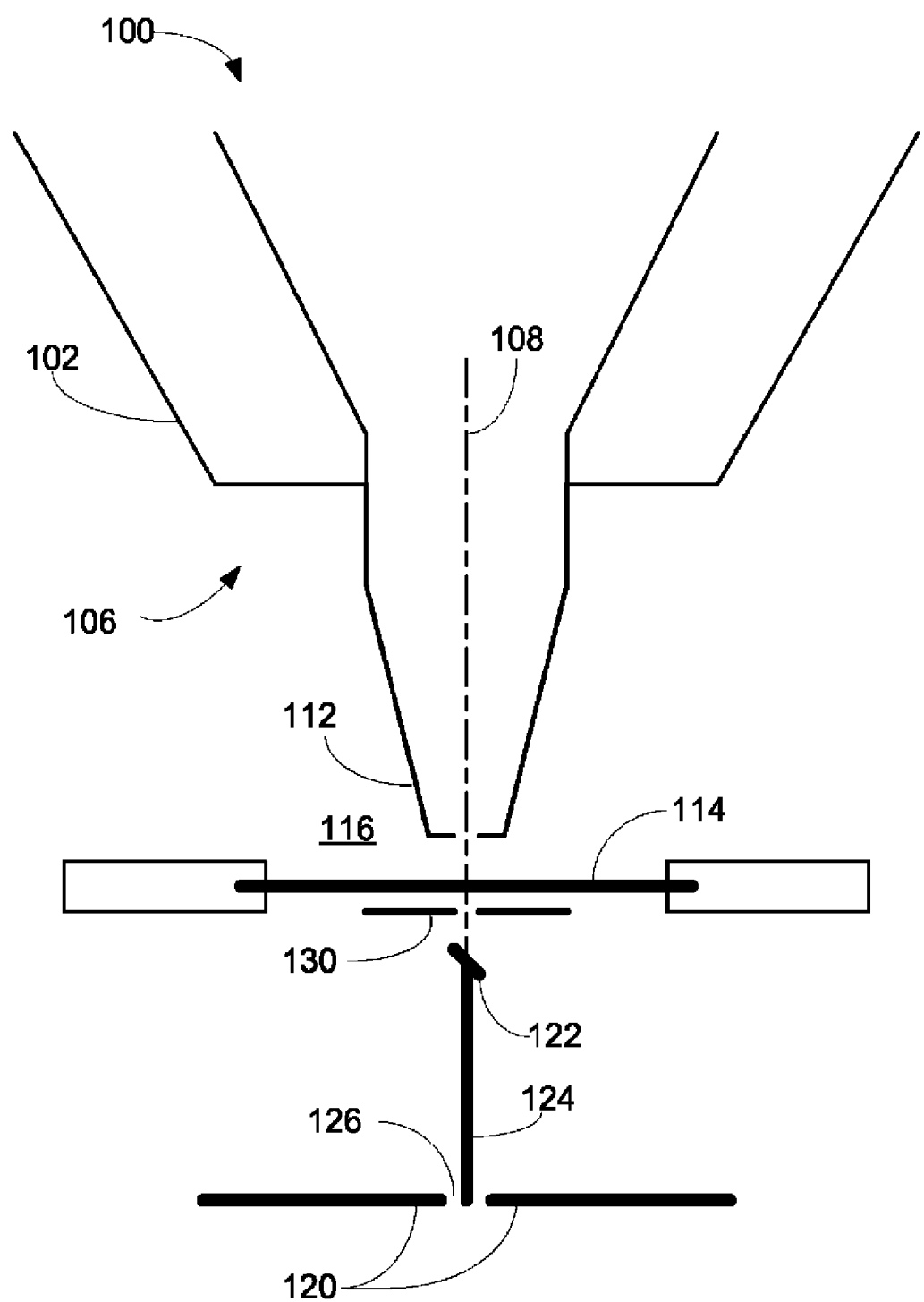
FIG. 1 shows a preferred embodiment of a gas amplification detector for a high pressure scanning transmission electron microscope.

Although those of ordinary skill in the art will readily recognize many alternative embodiments, especially in light of the illustrations provided herein, this detailed description is exemplary of the preferred embodiments of the present invention, the scope of which is limited only by the appended claims.

Gas amplification is very inefficient at amplifying the high energy electrons transmitted through a sample during scanning transmission electron microscopy. Some embodiments solve this problem by converting the high energy electrons into low energy secondary electrons, which can then be more efficiently amplified in the gas cascade. Gas amplified signals are also non-localized, so some embodiments separate scattered and unscattered transmitted electrons prior to the onset of significant cascade amplification.

Some embodiments allow the use of gas cascade amplification in a transmission electron microscope by producing a secondary electron signal corresponding either primarily to electrons that are not scattered as they pass through the sample or primarily to electrons that are scattered as they pass through the sample. The signals from the scattered and unscattered electrons are separated by controlling which electrons are converted to secondary electrons for efficient amplification, thereby allowing the production of an image with satisfactory contrast.

Preferred embodiments include at least a first and a second electrode placed generally underneath the sample at predetermined positions and distances from the sample. Electrons transmitted though the sample impinge on a first electrode and are converted to secondary electrons. The second electrode is positively biased relative to the first electrode to accelerate the secondary electrons in the gaseous environment, generating a gas ionization cascade to amplify the secondary electron signal. The amplified secondary electron signal is detected by the second electrode and used to form an image of the sample. In some embodiments, the voltages on the electrodes can be changed to change which electrode generates the secondary electrons and which electrode detects the electrons.

The use of gas cascade amplification offers several advantages over the use of a solid state detector. Because the active surfaces of preferred embodiments are simply constructed of typically solid metal, they are not as sensitive to contamination as are solid state crystal or scintillator-photomultiplier detectors. Because of their simple construction, metal electrodes can be easily cleaned or replaced at nominal cost. Metal electrodes made of materials such as stainless steel are not as sensitive to aggressive chemicals as are solid state detectors, and are therefore compatible with electron beam-assisted chemical processing. Moreover, the electron beam energy can be optimized for image contrast, rather than having to compromise for an electron energy that is sufficiently high for efficient detection by a depletion region or a scintillator. Lastly, a metal electrode does not require additional dedicated electronics for its use, as does a solid state detector. The same power supplies and electronics that are used to run the secondary electron detectors in high pressure SEM mode can be used to control a gas cascade STEM detector that uses metal electrodes.

FIG. 1 shows a preferred embodiment of the present invention that includes an electron microscope 100 having an objective lens 102 that forms part of an electron optical column 106 having an optical axis 108. A pressure limiting aperture 112 maintains pressure at a sample 114 in a sample region 116 at a higher pressure than the pressure in the electron column 106. As used herein, the term "aperture" refers not just to the hole, but to the structure in which the hole is formed. Pressure limiting aperture 112 preferably has a conical geometry to minimize beam scatter by the gas when the sample is placed at a working distance that is optimal for SEM operation. A first electrode 120, preferably in the shape of an annulus, is positioned below the sample and a second electrode 122, preferably in the shape of a disk, is positioned on the end of an electrode stand 124 between sample 114 and first electrode 120. The normal to major surface of electrode 122 is preferably tilted with respect to the optical axis 108 by an angle of between 0 and 90°, and most preferably by an angle of 98°. The angle increases the secondary electron emission yield, and the probability that secondary electrons emitted from the surface of electrode 122 will be amplified in the gas between electrode 120 and electrode 122. Electrode 122 is preferably positioned close to the sample, to maximize the distance between electrode 122 and electrode 120 to enhance gas amplification. The distance from electrode 122 to electrode 120 is preferably between 3 mm and 15 mm. The preferred distance may vary with the gas pressure and the species. Typical distances are between 1 mm and 30 mm. Typical gas pressures are between 100 mTorr and 10 Torr, and typical gases used include $H_2O$, $N_2$, air, $XeF_2$, $WF_6$ and styrene. For example, when $H_2O$ is used at a pressure of 5 Torr, the distance is 5 mm.

Second electrode 122 is electrically isolated from first electrode 120, for example, by gap 126. Alternatively, the gap 126 may be replaced by an electrically insulating material such as polytetrafluoroethylene (PTFE), polyetheretherketone (PEEK) or a ceramic. Alternatively, the stand 124 may be a metallic wire that connects the electrode 122 to ground or a power supply, but embedded in an insulating material. An aperture 130 blocks electrons that are scattered at greater than a predetermined maximum scattering angle by the sample 114. That is, aperture 130 defines the maximum angle with respect to the beam axis of transmitted electrons that are used to form a bright field STEM image.

The geometry and placement of the first electrode 120 may be changed to, for example, that of a needle located below the aperture 130. Such changes alter the electric field between electrodes 120 and 122 in a way that can enhance gas cascade amplification in some circumstances, as has been described by Toth et al. [*Applied Physics Letters* 91, 053122 (2007)]. It should be appreciated by those skilled in the art that such optimizations of the gas cascade amplification process are well understood and do not depart from the spirit and scope of the invention as set forth in the appended claims.

The maximum scattering angle can be controlled by setting the diameter of aperture 130 and the distance of aperture 130 from the sample 114, in accordance with simple geometry. Aperture 130 is optionally positioned on a manipulator that enables lateral alignment about the beam axis, and aperture translation along the beam axis. Aperture 130 is optionally an iris diaphragm that enables adjustment of the aperture diameter. Aperture 130 allows only electrons having less than the maximum scattering angle to reach electrode 122. The maximum scattering angle can be optimized for different sample types (defined by the composition and thickness), gas type and pressure, and beam energy. Thus, the aperture enables the embodiment of FIG. 1 to function as a bright field detector, detecting only unscattered electrons. Aperture 130 is preferably positioned close to sample 114 to minimize scattering of transmitted electrons by the gas before the electrons reach aperture 130. Transmitted electrons unscattered by the sample can be subsequently scattered by the gas and blocked by the aperture, and scattered transmitted electrons that should not pass through aperture 130 can be deflected by gas molecules to pass through the aperture. However, when imaging wet or liquid samples, the minimum distance between the aperture 130 and the sample 114 is limited by the maximum thickness of the liquid that can condense on the underside of the sample during HPSEM operation. If the distance between the aperture 130 and the sample 114 is too small, a layer of liquid can form between the sample and the aperture.

For example, for most applications, the aperture can have a diameter of between 50 microns and 2 mm, for example, 100 microns. The aperture is typically positioned between 0.5 mm and 5 mm, for example, 1 mm, from the bottom surface of the sample.

To achieve a bright field signal, it is desirable that transmitted, unscattered electrons produce secondary electrons to be amplified in a gas cascade, while transmitted, scattered electrons are prevented from contributing secondary electrons to be amplified in the gas cascade. The production of secondary electrons by transmitted electrons is sometimes referred to colloquially as "converting" the transmitted electrons to secondary electrons.

In some embodiments, aperture 130 is optionally biased negative with respect to the sample 114, for example, at −30 V, to reject secondary electrons emitted from the bottom surface of the sample 114 as the transmitted electrons exit the sample 114, and to reject secondary electrons emitted from the aperture 130 as some of the transmitted electrons impact the aperture 130 (or, more specifically, the structure in which the hole is formed). Secondary electrons that are rejected by an aperture 130 that is biased negative with respect to the sample 114 are directed to and collected by the sample 114, thereby preventing those secondary electrons from being amplified by the gas cascade. In other embodiments, aperture 130 is biased positive with respect to the sample 114, for example by +30 V, so as to reject secondary electrons by directing them to and collecting them by the structure in which the hole is formed.

Electrode 122 is optionally negatively biased (e.g., −20 V) to maximize the number of secondary electrons generated as a result of the impact of transmitted electrons that are amplified by the gas cascade and detected by the electrode 120. Sample 114 is optionally cooled, such as by a Peltier cooler, to enable observation by transmitted electrons of hydrated and liquid materials.

Figure 2:
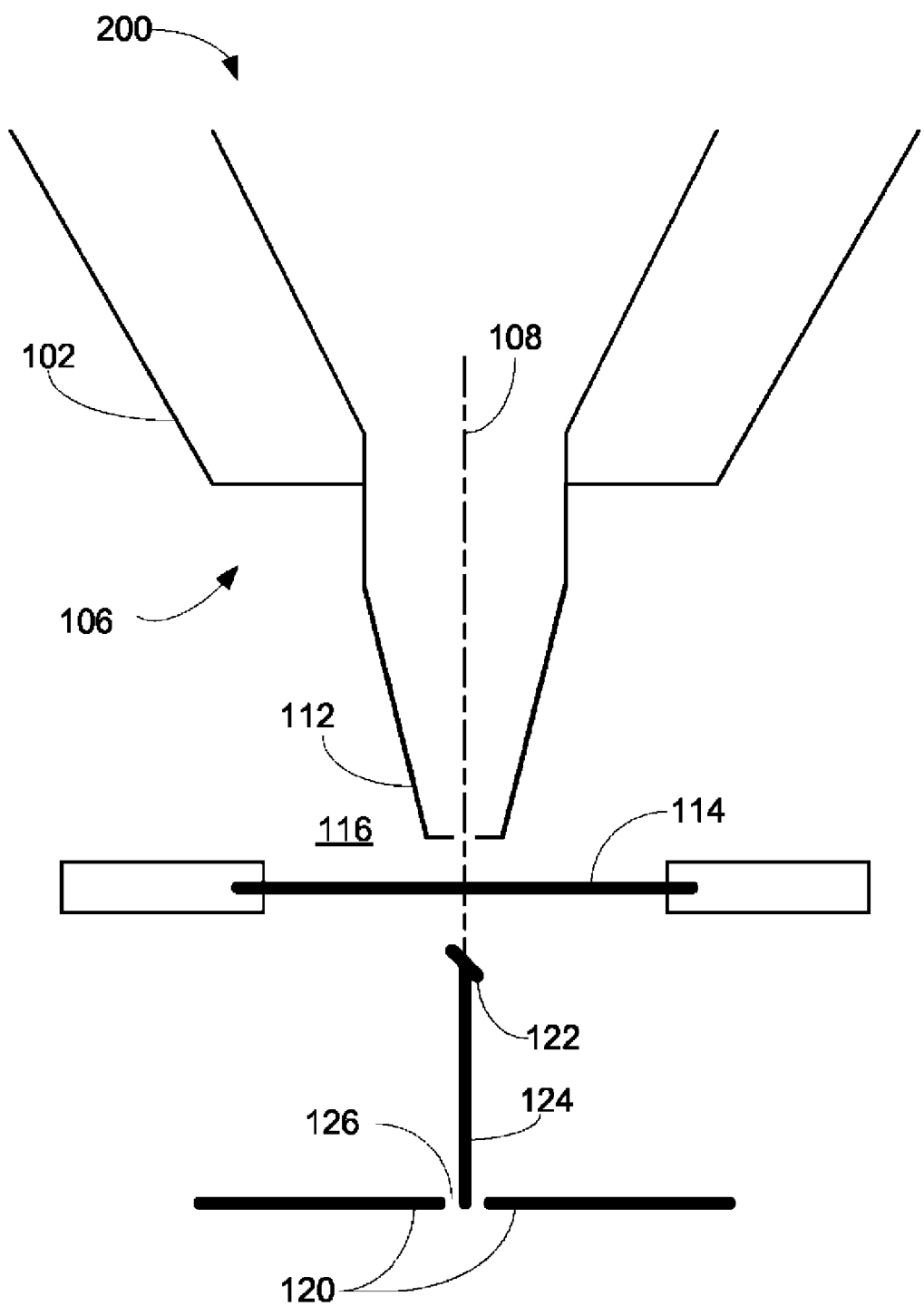
FIG. 2 shows a second embodiment of a gas amplification detector for a high pressure scanning transmission electron microscope.

FIG. 2 shows a scanning transmission electron microscope 200 having an alternate gas amplification detector, similar to that of FIG. 1, but without aperture 130. Identical elements in different figures are identified by the same reference numbers. Electrode 120 is biased positive with respect to electrode 122. For example, a strong positive bias, greater than about +300 V, is applied to electrode 120. Unscattered primary electrons hit electrode 122, which emits secondary electrons that are strongly amplified by the gas cascade mechanism. Transmitted scattered electrons miss electrode 122 and do not generate secondary electrons. Under normal conditions, that is, pressure between about 100 mTorr and 5 Torr, and distances between the sample 114 and detector 120 of between about 3 mm and 15 mm, the high energy transmitted electrons are poorly amplified in the gas and contribute little to the imaging signal. Thus, even without an aperture below the sample, a bright field signal can be obtained by ensuring that the unscattered electrons are converted to secondary electrons for amplification, and the scattered transmitted electrons are not converted. The maximum scattering angle is controlled by changing the diameter of the electrode 122, and the distance between the electrode 122 and the sample 114.

A dark field signal can be obtained by biasing electrode 120 negative with respect to the electrode 122. For example, a strong negative bias, smaller than about −300 V, is applied to electrode 120. Scattered primary electrons hit electrode 120, which generates secondary electrons which are directed to electrode 122 and are strongly amplified by the gas cascade mechanism. Transmitted unscattered electrons hit electrode 122 and generate secondary electrons that are recollected by electrode 122 without undergoing significant amplification by the gas cascade. Electrode 122 also collects secondary electrons emitted from the bottom side of sample 114 as transmitted electrons exit the sample 114. The efficiency of secondary electron collection by the electrode 122 can be improved by applying a positive bias, for example +30 V, to the electrode 122.

Figure 3:
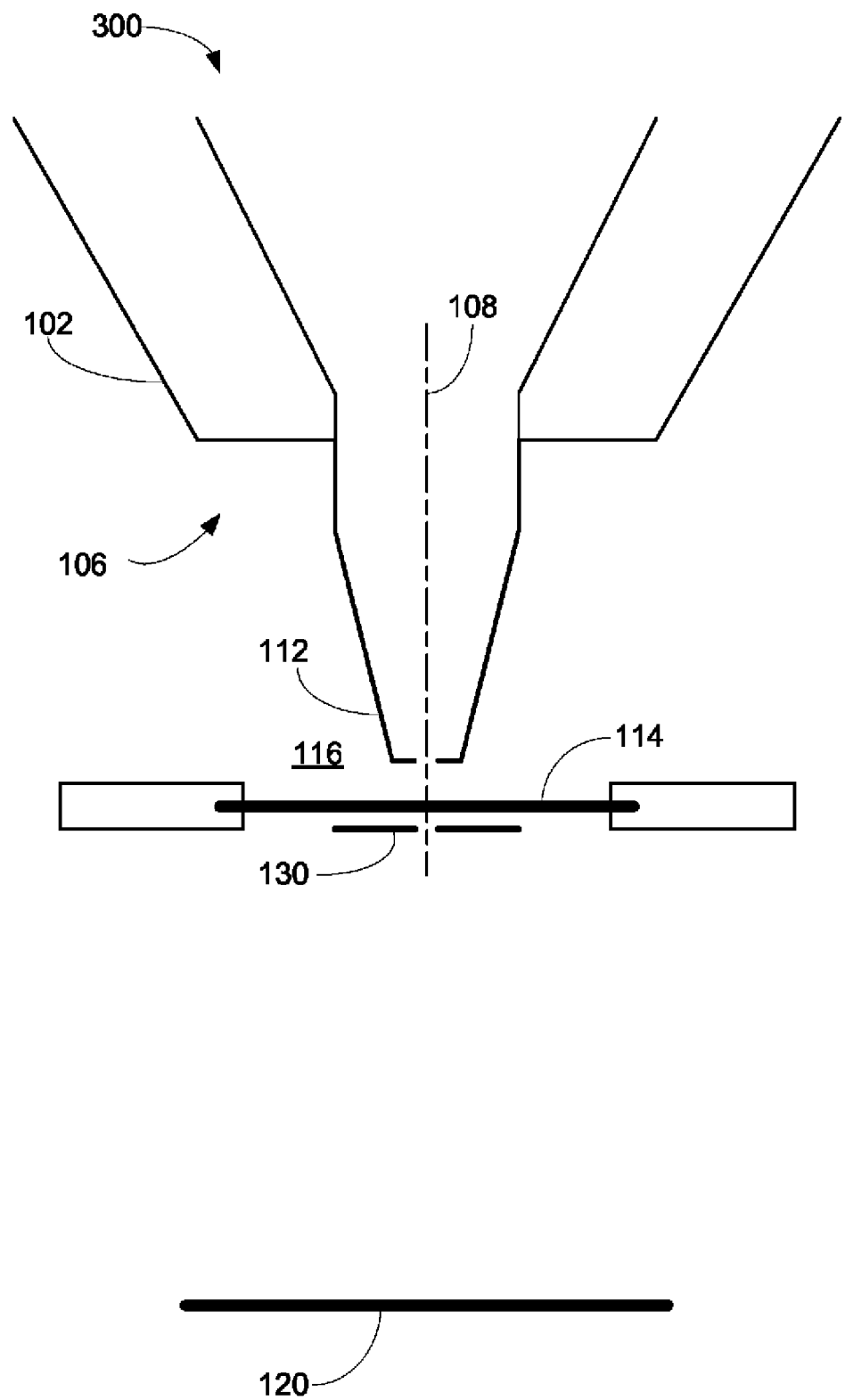
FIG. 3 shows a third embodiment of a gas amplification detector for a high pressure scanning transmission electron microscope.

FIG. 3 shows a scanning transmission electron microscope 300 having an alternate gas amplification detector, similar to that of FIG. 1, but without electrode 122. FIG. 3 relies on gas amplification of the transmitted electrons, rather than converting the transmitted electrons to low energy secondary electrons. The embodiment of FIG. 3 is, however, only optimal under relatively extreme conditions of low electron energy, high gas pressure or long transmitted electron gas path length. For example, the embodiment of FIG. 3 would be useful for an electron energy of about 10 keV, a gas pressure greater than about 5 Torr, and a distance between the sample and electrode 120 of greater than about 15 mm. Without the electrode 122 of FIG. 1, electrode 120 can be in the form of a disk, rather than an annulus.

In low voltage (less than 30 kV) STEM of typical HPSEM samples, such as hydrated bio tissue with a total thickness >=100 nm, low angle bright field electrons typically carry the most high resolution information. This differs from the more familiar case of conventional, high voltage (100-1000 kV) STEM because in low voltage STEM most transmitted electrons are multiply scattered by the sample.

Figure 4:
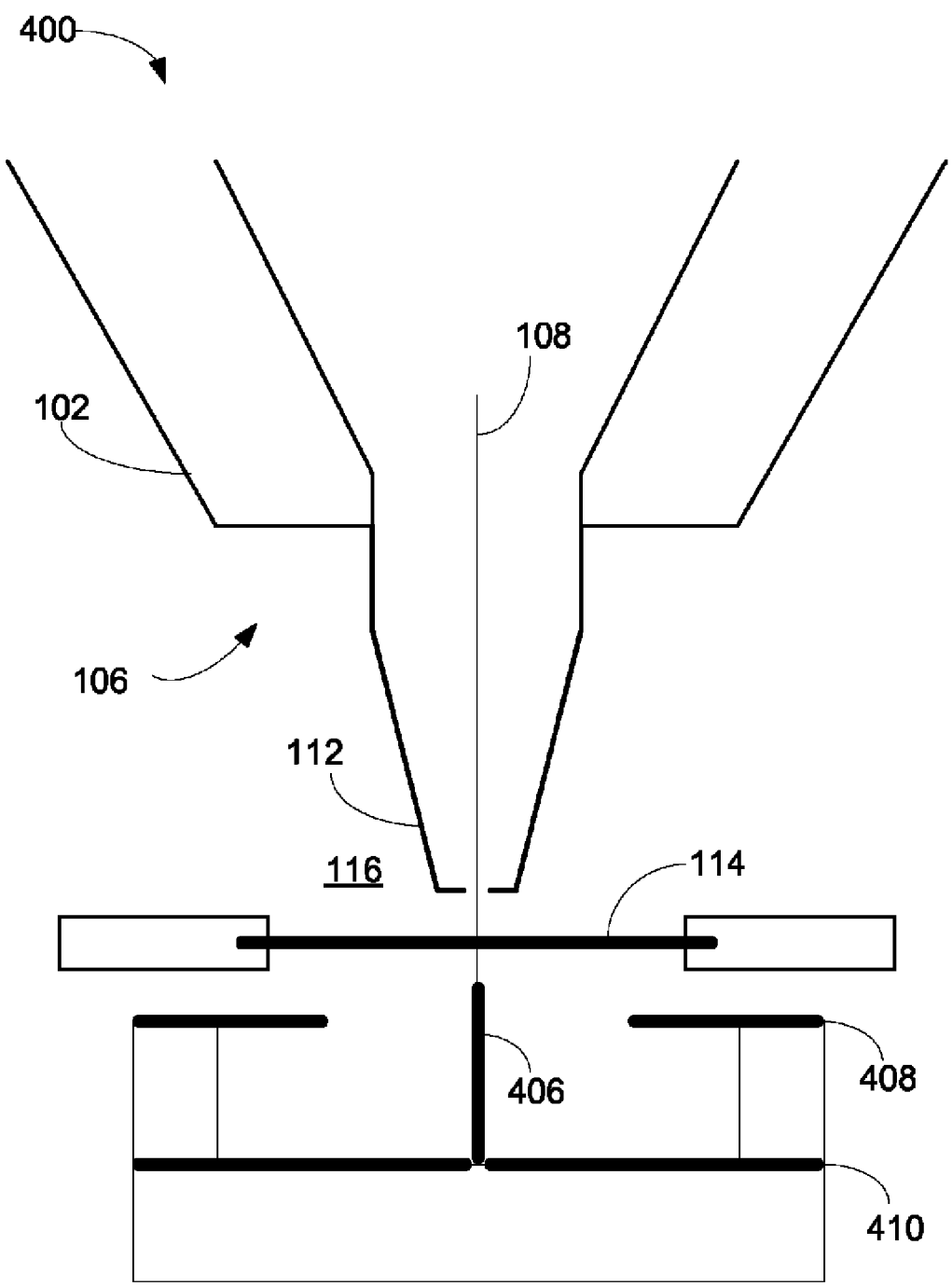
FIG. 4 shows a preferred embodiment of a selectable bright field or dark field gaseous STEM detector.

FIG. 4 shows a preferred embodiment of a STEM 400 that includes a STEM gas amplification detector that can be operated in a dark field mode or a bright field mode. A first electrode 406 in the form of a vertical rod extends from the plane of a second electrode 410. A second electrode 410 may be annular to provide a small gap to electrically insulate it from first electrode 406, or electrode 410 may be a solid disk and electrode 406 may be electrically insulated from electrode 410 using an insulating material. A third electrode 408 is positioned above second electrode 410 and may be annular. The diameter of the opening of third electrode 408 is sufficient to allow scattered transmitted electrons to reach second electrode 410. For example, the distance between the sample 114 and electrode 410 is typically between 5 mm and 20 mm. The distance between electrode 410 and electrode 408 is typically between 6 mm and 16 mm. Electrode 406 typically has a diameter of about 500 microns and extends to about 2 mm from the sample, to collect electrons having a scattering angle of less than 7°. Gas pressures used are similar to those of the previous embodiments.

Bright field imaging mode or dark field imaging mode can be selected by varying the voltage applied to the three electrodes. When operated in bright field imaging mode, unscattered, transmitted electrons impinge on the first electrode 406 and generate secondary electrons. The secondary electrons are accelerated toward second electrode 410 for gas amplification and detected by electrode 410. In dark field imaging mode, transmitted, scattered electrons impinge on second electrode 410 and generate secondary electrons, which are accelerated toward third electrode 408 and detected by third electrode 408.

In bright field imaging mode of the preferred embodiment of FIG. 4, first electrode 406 preferably has a slight negative bias (e.g. approx. −10 V), third electrode 408 is preferably grounded (e.g. 0 V), and second electrode 410 preferably has a positive bias (e.g. +500 V). For dark field imaging, first electrode 406 may have a positive bias (e.g. +100 V), third electrode 408 may be grounded, and second electrode 410 may have a negative bias (e.g., −300 V). Electrode 410 can be divided into multiple ring segments or fractional ring segments to detect transmitted electrons that are scattered through different ranges of scattering angles. Segments from which transmitted electrons are not to be detected can be biased positively to prevent secondary electrons from leaving the segment and participating in gas amplification. Segmented detectors are useful because scattering can have preferred directions in crystalline materials due to channeling. Each ring segment would need to be sufficiently wide to achieve a useful signal and the number of rings used is preferably less than three.

Figure 5:
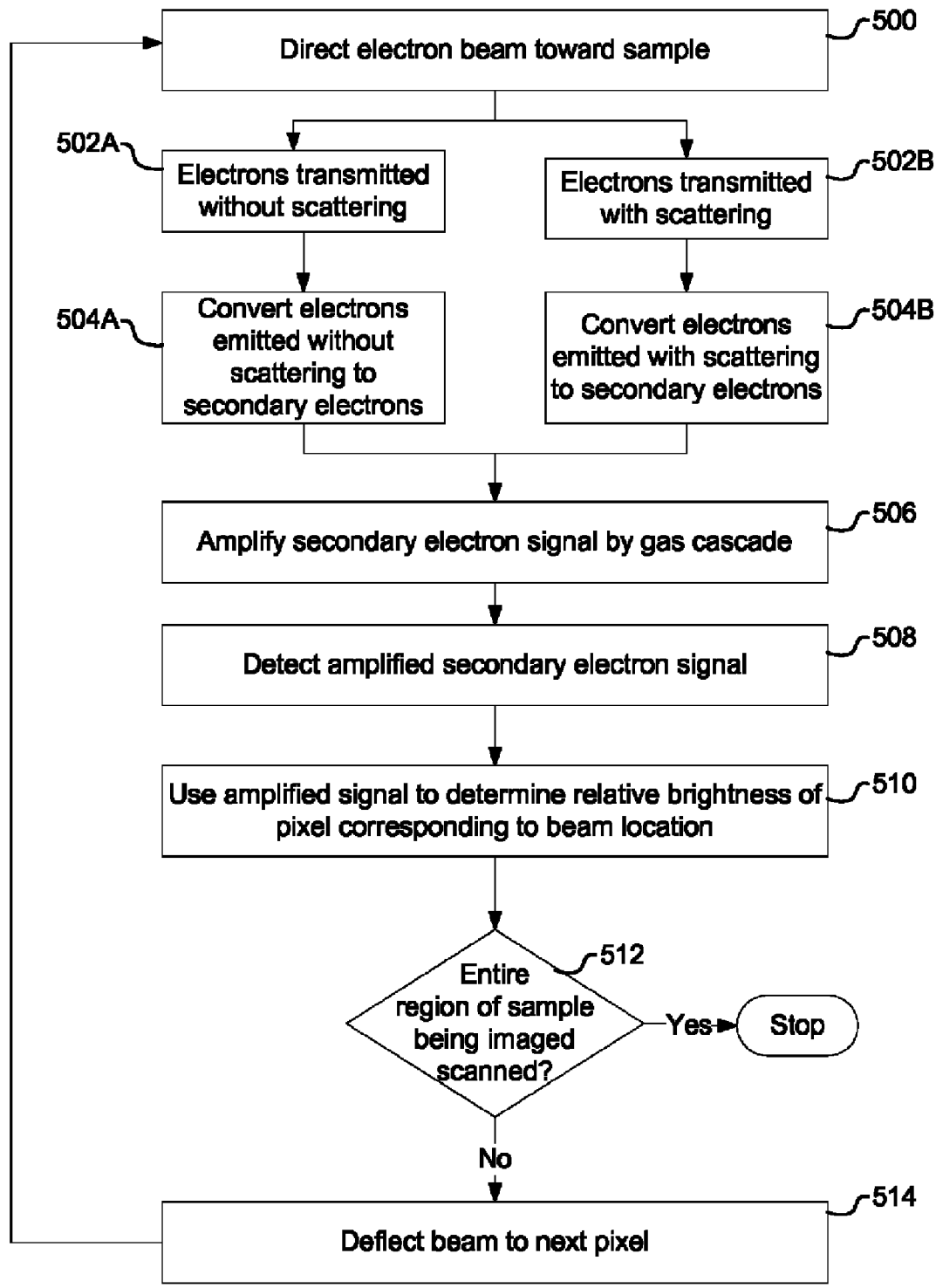
FIG. 5 is a flowchart showing the operation of a gas amplification detector for a scanning transmission electron microscope.

FIG. 5 is a flow chart showing the steps of a preferred method in accordance with the present invention. While the steps are shown as a sequence, skilled person will understand that many of the steps are occurring simultaneously. In step 500, an electron beam is directed toward a point on a sample. In step 502, some electrons in the primary beam are transmitted without scattering (502A), while some electrons are transmitted and scattered (502B). Some primary electrons may also be backscattered or absorbed and not transmitted. In step 504A, which represents bright field imaging, the transmitted unscattered electrons are converted into secondary electrons. In step 504B, which represents dark field imaging, the transmitted scattered electrons are converted into secondary electrons. In step 506, the secondary electrons are amplified by gas cascade ionization and in step 508, the amplified electron signal is detected by a detection electrode. In step 510, the detected signal is used to determine the relative brightness of a pixel on an image. If it is determined in decision block 512 that the entire region of the sample being imaged has not yet been scanned, then in step 514, the electron beam is deflected to the next pixel, and steps 500 to 510 are repeated. The process repeats until the electron beam has scanned the entire region of the sample that is being imaged.

The various electrodes in the embodiments described above allow a user to selectively determine which transmitted electrons will produce secondary electrons for gas amplification, thereby allowing the separation of scattered and unscattered transmitted electrons. Some embodiments block the unwanted transmitted electrode to prevent them from reaching a detector electrode, and other embodiments rely on the poor amplification, compared to secondary electrons, of high energy transmitted electrons in the gas amplification process. While the high energy transmitted electrons are not amplified strongly under typical operating conditions, embodiments can use the high energy transmitted electrons for gas amplification, with a combination of higher gas pressure and longer distance between the sample and the collection electrode.

Converting high energy transmitted electrons to secondary electrons provides for high gain at both low primary beam energy, such as less than 5 keV, and high beam energy, such as greater than 30 keV, thereby allowing for a wide array of samples to be observed. The gas amplification in any of the embodiments above can be performed in multiple stages, as described in co-pending U.S. patent application Ser. No. 12/059,850, filed Mar. 31, 2008, for a "Multistage Gas Cascade Amplifier," which is hereby incorporated by reference.

As transmitted electrons from the electron beam penetrate the sample and impinge on the first electrode, the transmitted electrons are converted to secondary electrons. The second electrode is positively biased to generate a gas ionization cascade initiating with the secondary electrons. An imaging signal is detected by the second electrode as the ions impinge upon it.

U.S. Prov. Pat. App. No. 60/900,028 for "High Pressure Charged Particle Beam System," which is by the same inventors as the present application and is assigned to FEI Company, the assignee of the present invention, describes a system that solves a number of problems inherent to electron-beam induced chemical processing in an HPSEM, and is incorporated herein by reference. U.S. Prov. Pat. App. 60/900,028 teaches the use of a sample cell for maintaining a sample in a high pressure environment. Such sample cells, also referred to as "environmental cells," can be combined with the present invention, to provide gas amplification in a STEM with the sample placed a sample cell. For example, the detectors described above can be positioned under the sample in a sample cell. Some embodiments provide both a detector above the sample for SEM mode observation and a detector below the sample for STEM mode observation.

Figure 6:
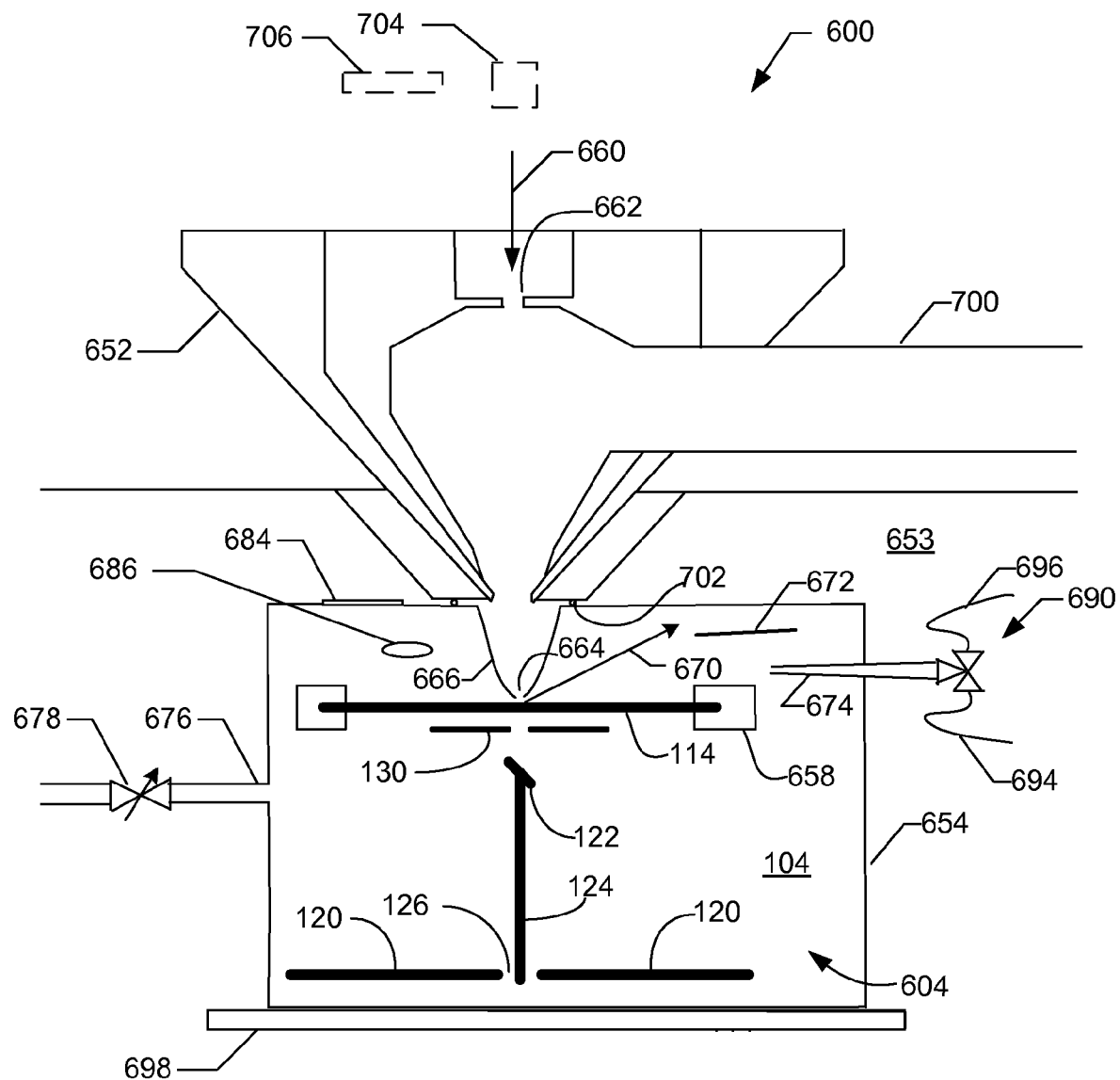
FIG. 6 shows a second embodiment of a selectable bright field or dark field gaseous STEM detector.

FIG. 6 shows a cross-sectional view of a preferred embodiment of a particle-optical apparatus 600 that includes a sample cell 654 including a STEM detector 604 using gas cascade amplification. Particle-optical apparatus 600 includes a pinhole magnetic objective lens 652, a sample chamber 653 having within it a sample cell 654 for maintaining a sample 114 at a relatively high pressure on a stage 658. A particle source (not shown) provides a primary electron beam 660 that passes through an upper PLA 662 and a lower PLA 664 at the bottom of a cone 666. PLA 664 preferably has a diameter of less than 500 μm to minimize gas leakage into the electron focusing column. Cone 666 reduces the path of the electron beam 660 through the gas in cell 654. Secondary electrons 670 emitted from the sample are detected in SEM mode by a secondary electron detector 672 built into cell 654 and positioned to enable detection inside cell 654.

The distance between detector 672 and the sample provides a sufficient electron path for collisions between electrons and the gas to significantly amplify the electron current. For example, there are typically more than 300 electrons, more than 500 electrons, or more than 1000 electrons reaching detector 672 for each electron leaving the sample. Detector 672 detects a current induced by the flow of charge in the gas cascade to form an image. In other embodiments, a photon detector can be used to detect photons emitted from the cascade to form an image. The photons are emitted by excited ions, fragments or neutrals, either in the gas or upon contact with surfaces inside the sample cell or the sample chamber.

A gas input 674 and a gas output 676 regulate the flow rate and pressure of a process or imaging gas inside the sample cell 654. Gas output 676 is connected through a leak valve 678 to a roughing pump (not shown). A controlled leak through valve 678 and the relatively small volume of cell 654 compared to the volume of sample chamber 653 provides for rapid switching between different processing gases, for example, to switch between beam chemistry mode and imaging mode. Particle-optical apparatus 600 can function at relatively high pressure, that is, greater than 20 Torr (26 mbar). Particle-optical apparatus 600 can preferably function at 50 Torr (65 mbar) or higher. Higher pressure provides faster maximum processing rates and the ability to image hydrated materials at room and body temperature. In some embodiments, the pressure in the cell 654 is greater than 10 mTorr, while the pressure in the sample chamber 653 is less than 10 mTorr.

Secondary electron detector 672, which is in the form of a needle, is electrically biased to preferably more than 100 V, more preferably greater than 300 V, and most preferably about 500 volts to attract secondary electrons, which collide with gas molecules between sample 114 and secondary electron detector 672 to create an ionization cascade to amplify the secondary electron signal. The combination of cone 666 with the configuration of secondary electron detector 672, which is positioned outside of the cone, allows for a sufficient secondary electron path within the gas to provide adequate secondary electron signal amplification, while maintaining a short primary electron path through the gas. The secondary electron path from the sample to the detector is preferably greater than 2 mm, more preferably greater than 5 mm and even more preferably greater than 10 mm. An optically transparent window 684 allows a user to observe the sample through an optical microscope (not shown) using a lens 686 positioned between window 684 and sample 114. The optical window 684 allows system 600 to provide a wide field view, while still providing a short gas path length and a low rate of gas leakage into the column, which improves resolution and image signal-to-noise ratio, and protects the column from corrosive gases.

Gas input 674 includes a valve arrangement 690 that allows for rapid switching between multiple gas feeds, such as a one or more process gas feeds 694 and an imaging gas feed 696. A duct 700 allows for evacuation of gases that pass through PLA 664, thereby helping to maintain a lower column pressure above upper PLA 662. A stage 698 allows the position of cell 654 to be adjusted so that PLA 664 is aligned with the axis of electron beam 660, while stage 658 allows movement and preferably tilting of the sample 114 within cell 654 so that a region of interest on the sample 114 can be positioned under the electron beam 660. Stage 658 supports the sample 114 while allowing electrons to be transmitted through sample 114. A seal 702, such as a Viton o-ring or a Teflon seal, preferably provides a gas-tight seal between lens 652 and cell 654 to prevent gases from cell 654 entering sample chamber 653. Seal 702 could also be a non-gas tight seal provided by a small gap that acts as a gas flow restriction between the sub-chamber and sample chamber 653. FIG. 6 also shows an optional secondary electron deflector 704, such as a Wien filter, that defects secondary electrons away from the primary beam axis and into detector 706, while passing the primary beam 660 without deviation.

STEM detector 604 is positioned under sample 114 and functions as described above with respect to FIG. 1. Reference numbers in FIG. 6 that are the same as those in FIG. 1 refer to the same features, although the implementation of those features may change in the implementation of FIG. 6. Other types of sample cells, such as the other cells shown in U.S. Prov. Pat. App. No. 60/900,028 can also be used with gaseous STEM detectors, such as the ones shown in FIGS. 1 though 4 and others.

While embodiments described above detect electrons using metal electrodes, the electron signal can also be detected using a photon detector, which detects photons generated by the cascade.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable. While the foregoing description is exemplary of the preferred embodiments of the present invention, those of ordinary skill in the relevant arts will recognize the many variations, alterations, modifications, substitutions and the like as are readily possible, especially in light of this description, the accompanying drawings and claims drawn thereto. In any case, because the scope of the present invention is much broader than any particular embodiment, the foregoing detailed description should not be construed as a limitation of the scope of the present invention, which is limited only by the claims appended hereto.

We claim as follows:

1. The method of observing a specimen, comprising:
   directing a primary beam of electrons toward a sample maintained in a gaseous environment;
   amplifying an electron signal from electrons transmitted through the sample using gas amplification;
   detecting the amplified electron signal; and
   using the detected electron signal to form an image of the sample.

2. The method of claim 1 in which detecting the amplified electron signal includes detecting the amplified electron signal using a metal electrode.

3. The method of claim 1 in which amplifying an electron signal from electrons transmitted through the sample includes generating secondary electrons from electrons transmitted through the sample, the secondary electrons being amplified using gas amplification.

4. The method of claim 3 in which amplifying an electron signal from electrons transmitted through the sample includes providing an electrical potential difference between an electrode that converts transmitted electrons to secondary electrons and a detector electrode to accelerate electrons toward the detector electrode.

5. The method of claim 3 which amplifying an electron signal from electrons transmitted through the sample includes converting essentially only transmitted electrons deflected by less than a specified angle to secondary electrons, or converting essentially only transmitted electrons deflected by more than a specified angle to secondary electrons, thereby separating a bright field signal from a dark field signal.

6. The method of claim 1 in which amplifying an electron signal from electrons transmitted through the sample includes amplifying an electron signal from electrons that are transmitted through the sample and are deflected by less than a predetermined angle.

7. The method of claim 1 in which amplifying an electron signal from electrons transmitted through the sample includes amplifying an electron signal from electrons that are transmitted through the sample and are deflected by greater than a predetermined angle.

8. The method of claim 1 in which detecting the amplified electron signal includes detecting photons emitted by electrons in a gas cascade.

9. An electron microscope for observing a sample in a high pressure environment, comprising:
a source of primary electrons;
an electron optical column including electron optical elements for forming the primary electrons into a beam and deflecting the beam;
a sample region;
a pressure limiting aperture to maintain a lower pressure in the electron optical column than in the sample region; and
a detector including at least one metal electrode positioned on the opposite end of the sample from the electron optical column, the detector detecting electrons transmitted though the sample and amplified by gas cascade amplification.

10. The electron microscope of claim 9 further comprising a source of gas for the sample region.

11. The electron microscope of claim 9 further comprising an aperture-containing structure positioned between the sample and the metal electrode, the aperture-containing structure blocking transmitted electrons that are scattered by greater than a predetermined angle.

12. The electron microscope of claim 9 in which the detector includes a second electrode for converting transmitted electrons to secondary electrons.

13. The electron microscope of claim 12 in which the second electrode is positioned between the sample and the detector electrode.

14. The electron microscope of claim 13 in which the second electrode is positioned on a post extending toward the sample from the plane of the detector electrode.

15. The electron microscope of claim 9 in which the detector includes at least two electrodes, the detector being configurable as a bright field detector or a dark field detector, depending on the electrical potentials maintained on the at least two electrodes.

16. The electron microscope of claim 15 in which the electron microscope includes an optical axis and in which the at least two electrodes includes a first electrode positioned to be struck by electrons transmitted through the sample along the optical axis.

17. The electron microscope of claim 16 in which a second of the at least two electrodes is configurable to either detect secondary electrons emitted by the first electrode upon impact by electrons transmitted through the sample and amplified by gaseous amplification, or is configurable to emit secondary electrons when impacted by electrons transmitted through and scattered by the sample, the secondary electrons being amplified by gas amplification and the gas amplified signal being detected by the first electrode, the second electrode or by a third electrode.

18. The electron microscope of claim 16 in which a third electrode is positioned a sufficient distance from the second electrode to provide gas amplification of secondary electrons emitted when scattered transmitted electrons impact the second electrode, an amplified electron signal being detected by the third electrode when an appropriate voltage is applied between the second and third electrodes.

19. The electron microscope of claim 18 in which the first electrode is supported on a post extending toward the sample from the plane of the third electrode.

20. The electron microscope of claim 16 in which a second electrode is positioned a sufficient distance from the first electrode to provide gas amplification of a secondary electron signal from the first electrode, an amplified electron signal being detected by the second electrode when an appropriate electric potential difference is applied between the first and second electrodes.

21. The electron microscope of claim 9 further comprising a sample cell for receiving a sample and for containing the detector, the sample cell including a gas inlet for providing gas for the gas amplification.

22. The electron microscope of claim 9 in which the detector comprises a photon detector for detecting photons produced by electrons in the gas cascade.

* * * * *